(12) United States Patent
Lee

(10) Patent No.: US 7,652,354 B2
(45) Date of Patent: Jan. 26, 2010

(54) SEMICONDUCTOR DEVICES AND METHODS OF MANUFACTURING SEMICONDUCTOR DEVICES

(75) Inventor: Tae Young Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 260 days.

(21) Appl. No.: 11/555,381

(22) Filed: Nov. 1, 2006

(65) Prior Publication Data

US 2007/0123030 A1 May 31, 2007

(30) Foreign Application Priority Data

Nov. 2, 2005 (KR) ...................... 10-2005-0104311

(51) Int. Cl.
H01L 21/00 (2006.01)
(52) U.S. Cl. ...................... 257/635; 257/636; 257/638; 257/760; 257/773; 257/E21.211; 257/E21.276; 257/E21.279; 257/E21.579; 257/E21.577; 438/624; 438/637; 438/672; 438/725; 438/787
(58) Field of Classification Search ................. 438/637, 438/622, 624, 631, 687; 257/E21.276, 279, 257/571, 576, 579
See application file for complete search history.

(56) References Cited

U.S. PATENT DOCUMENTS

| | | | |
|---|---|---|---|
| 5,602,056 A * | 2/1997 | Jain et al. .................... 438/586 |
| 6,166,427 A * | 12/2000 | Huang et al. ................. 257/635 |
| 6,232,217 B1 * | 5/2001 | Ang et al. .................... 438/624 |
| 6,348,407 B1 * | 2/2002 | Gupta et al. ................. 438/637 |
| 6,451,687 B1 * | 9/2002 | Liu et al. ..................... 438/624 |
| 6,759,347 B1 * | 7/2004 | Cheng et al. ................. 438/778 |
| 7,186,640 B2 * | 3/2007 | Huang et al. ................. 438/622 |
| 7,214,609 B2 * | 5/2007 | Jiang et al. .................. 438/637 |
| 2001/0017402 A1 * | 8/2001 | Usami ......................... 257/642 |
| 2003/0235980 A1 * | 12/2003 | Huang et al. ................. 438/638 |
| 2004/0152336 A1 * | 8/2004 | Miura et al. ................. 438/761 |
| 2005/0079734 A1 | 4/2005 | Park |
| 2009/0166878 A1 * | 7/2009 | Seok .......................... 257/773 |

FOREIGN PATENT DOCUMENTS

| | | |
|---|---|---|
| CN | 1148269 | 4/1997 |
| JP | 2006278493 A * | 10/2006 |
| KR | 10-1999-0057835 | 7/1999 |

* cited by examiner

*Primary Examiner*—Michael S Lebentritt
(74) *Attorney, Agent, or Firm*—Sherr & Vaughn, PLLC

(57) ABSTRACT

Disclosed is a semiconductor device and a method of manufacturing a semiconductor device. A semiconductor device may include an insulating layer and a metal interconnection. An insulating layer may include a first layer including fluorine and a second layer including SRO (silicon rich oxide) having a dangling bond. A metal interconnection may be formed over the insulating layer.

19 Claims, 6 Drawing Sheets

SEMICONDUCTOR DEVICES AND METHODS OF MANUFACTURING SEMICONDUCTOR DEVICES

The present application claims priority under 35 U.S.C. 119 and 35 U.S.C. 365 to Korean Application No. 10-2005-0104311 (filed on Nov. 2, 2005), which is hereby incorporated by reference in its entirety.

BACKGROUND

Semiconductor devices may electrically connects layers using metal interconnections. Metal interconnections may be formed from metallic thin films (e.g. aluminum, aluminum alloys, copper, and/or other similar material). Metal interconnections may have multi-layer structures. An inter-metal dielectric (IMD) layer may have a via hole formed between a first metal interconnection and a second metal interconnection.

The inter-metal dielectric layer may include a material having a low-dielectric (low-k) constant. An inter-metal dielectric layer may have a via hole for electrically connecting a first metal interconnection and a second metal interconnection. An inter-metal dielectric layer may insulate a first metal interconnection from a second metal interconnection to minimize parasitic capacitance caused by overlapping of the first metal interconnection and second metal interconnection. An inter-metal dielectric layer may insulate a first metal interconnection from a second metal interconnection to reduce cross-talk noise.

An inter-metal dielectric layer may be formed using FSG (fluorine-doped silicate glass) including fluorine (F). Fluorine may have a desirable hydrophilic property in certain applications. Fluorine may react with air or moisture to produce hydrogen fluoride (HF). Hydrogen fluoride may lower adhesion properties. Adhesive forces between an inter-metal dielectric layer and a metal interconnection may be lowered due to hydrogen fluoride, which may cause defects in the metal interconnection. Since fluorine may have a relatively high diffusivity, fluorine may diffuse into a metal interconnection adjacent to an inter-metal dielectric layer. A metal interconnection may be eroded, degrading the quality and/or lowing the reliability of a semiconductor device.

A peeling process may be performed to remove hydrogen fluoride. However, a peeling process may cause a manufacturing process of a semiconductor device to be complicated.

SUMMARY

Embodiments relate to a semiconductor device and/or a method of manufacturing a semiconductor device that may substantially prevent defects in a metal interconnection. In embodiments, a semiconductor device and/or a method of manufacturing a semiconductor device may prevent defects in a metal interconnection by restricting diffusion of fluorine in an inter-metal dielectric layer. In embodiments, a semiconductor device and/or a method of manufacturing a semiconductor device may improve adhesion force by restricting reaction of fluorine in an inter-metal dielectric layer. In embodiments, a semiconductor device and/or a method of manufacturing a semiconductor device may simplify a manufacturing process of a semiconductor device by omitting a peeling process that removes hydrogen fluoride.

In embodiments, a semiconductor device may include an insulating layer and/or a metal interconnection. An insulating lay may have a first layer that includes fluorine and a second layer that includes SRO (silicon rich oxide) which has a dangling bond. A metal interconnection may be formed on an insulating layer.

In embodiments, a semiconductor device comprises a first insulating layer, a first metal interconnection, a second insulating layer, and/or a second metal interconnection. A first insulating layer may be formed on a semiconductor substrate and may have a first via hole. A first metal interconnection may be formed in a first via hole. A second insulating layer may be formed on a first insulating layer and may have a second via hole. A second metal interconnection may be formed in a second via hole and may be electrically connected to a first metal interconnection. A metal pad may be formed on a second insulating layer and may be electrically connected to a second metal interconnection. A first insulating layer and a second insulating lay may have a first layer including fluorine and a second layer including SRO (silicon rich oxide) having dangling bonds.

In embodiments, a semiconductor device includes a first insulating layer, a metal interconnection, a second insulating layer, and a metal pad. A first insulating layer may have a first via hole and a trench in communication with the first via hole. A metal interconnection may be formed in a first via hole and a trench. A second insulating layer may be formed on first insulating layer including fluorine, which may have a second via hole. A metal pad may be formed in a second via hole. A first diffusion barrier may be interposed between a second insulating layer and a metal pad. A first diffusion barrier may include SRO (silicon rich oxide) having a dangling bond.

Embodiments relate to a method of manufacturing a semiconductor device, the method including at least one of the following: Forming a first layer including fluorine on a semiconductor substrate. Forming a second layer including SRO (silicon rich oxide) having a dangling bond on a first layer. Forming a via hole by patterning a first layer and a second layer. Forming a metal interconnection in a via hole.

BRIEF DESCRIPTION OF THE DRAWINGS

Example

Example

Example

Example

DETAILED DESCRIPTION OF THE INVENTION

Figure 1:
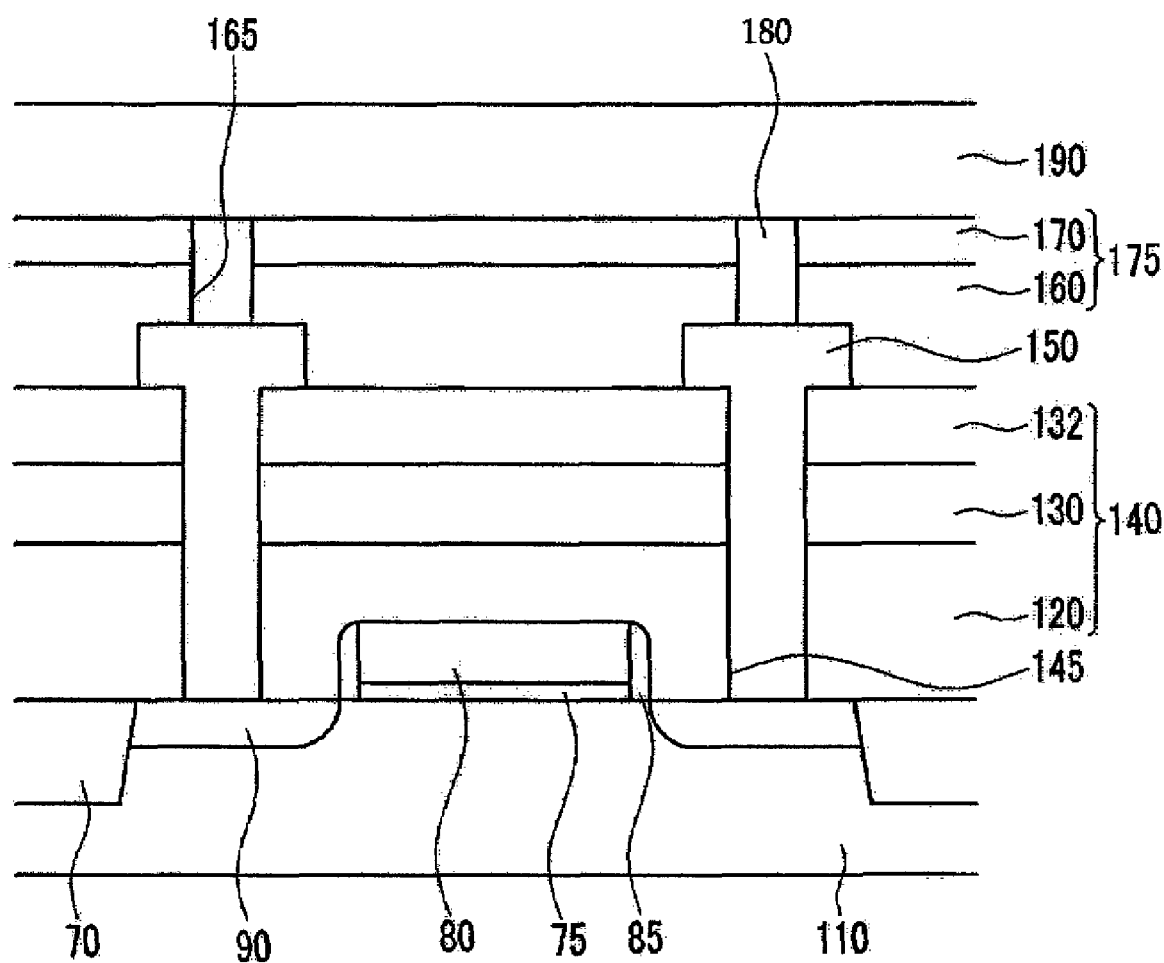
FIG. 1 is a sectional view illustrating a semiconductor device, according to embodiments.

Example FIG. 1 is a sectional view illustrating a semiconductor device, according to embodiments. As illustrated in FIG. 1, gate insulating layer 75 and gate electrode 80 may be sequentially formed over semiconductor substrate 110. Semiconductor substrate 110 may include isolation layer 70 and high-density junction area 90. Spacer 85 may be formed on the side of gate electrode 80 and gate insulating layer 75.

First inter-metal dielectric (IMD) layer 140 may have first via hole 145 formed over the semiconductor substrate 110. First metal interconnection 150 may be formed on first inter-metal dielectric layer 140 by filling first via hole 145 in first inter-metal dielectric layer 140. Second inter-metal dielectric layer 175 may have second via hole 165 formed over first inter-metal dielectric layer 140 and first metal interconnection 150. Second via hole 165 may be filled with second metal interconnection 180. Metal pad 190 may be formed over second inter-metal dielectric layer 175 and second metal interconnection 180.

First inter-metal dielectric layer 140 may include a HDP (high density plasma) insulating layer 120, which may include at least one of USG (undoped silicate glass) and/or FSG (fluorine-doped silicate glass). TEOS (tetraethyl ortho silicate) layer 130 may be formed over HDP insulating layer 120. First diffusion barrier 132 may be formed over TEOS layer 130. First diffusion barrier 132 may including SRO (silicon rich oxide) that may contain silane ($SiH_4$). First diffusion barrier 132 may have a thickness of at least 1000 Å, in accordance with embodiments. In embodiments, TEOS layer 130 has a thickness in a range of 7500 Å to 8000 Å.

Second inter-metal dielectric layer 175 may include HDP insulating layer 160. HDP insulating layer 160 may include at least one of USG (undoped silicate glass) and/or FSG (fluorine-doped silicate glass). Second inter-metal dielectric layer 175 may include a second diffusion barrier 170, which may be formed over the HDP insulating layer 160. In embodiments, second diffusion barrier 170 may include a material identical to the material of first diffusion barrier 132.

Figure 2:
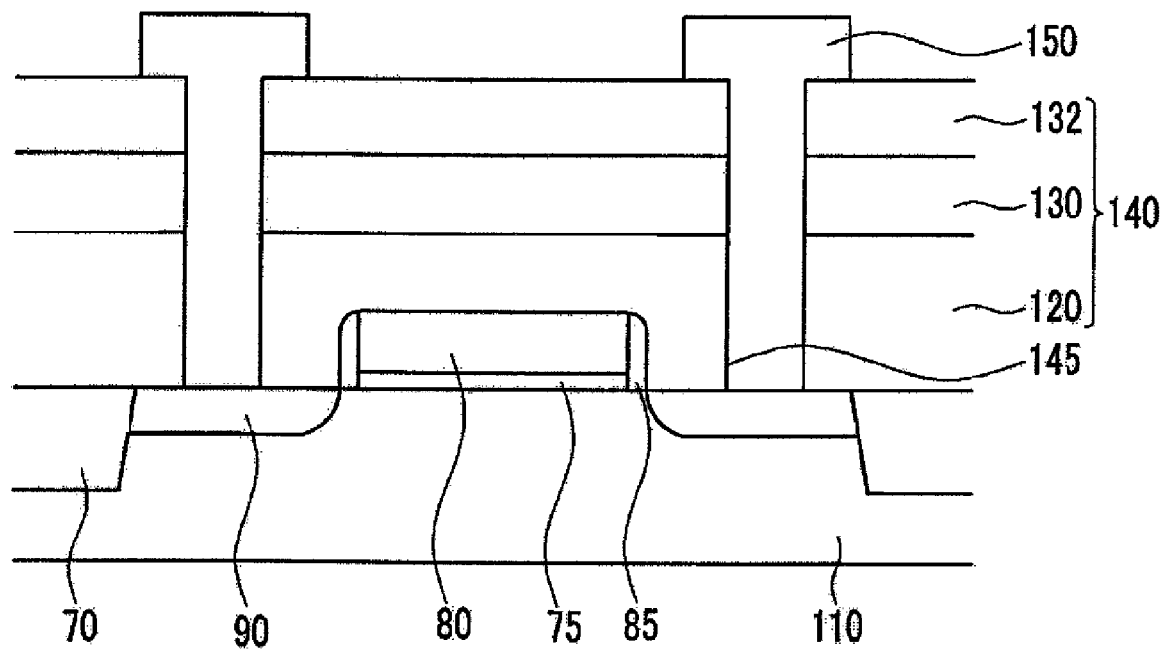
FIGS. 2 and 3 are sectional views illustrating a manufacturing process of a semiconductor device, according to embodiments.
Figure 3:
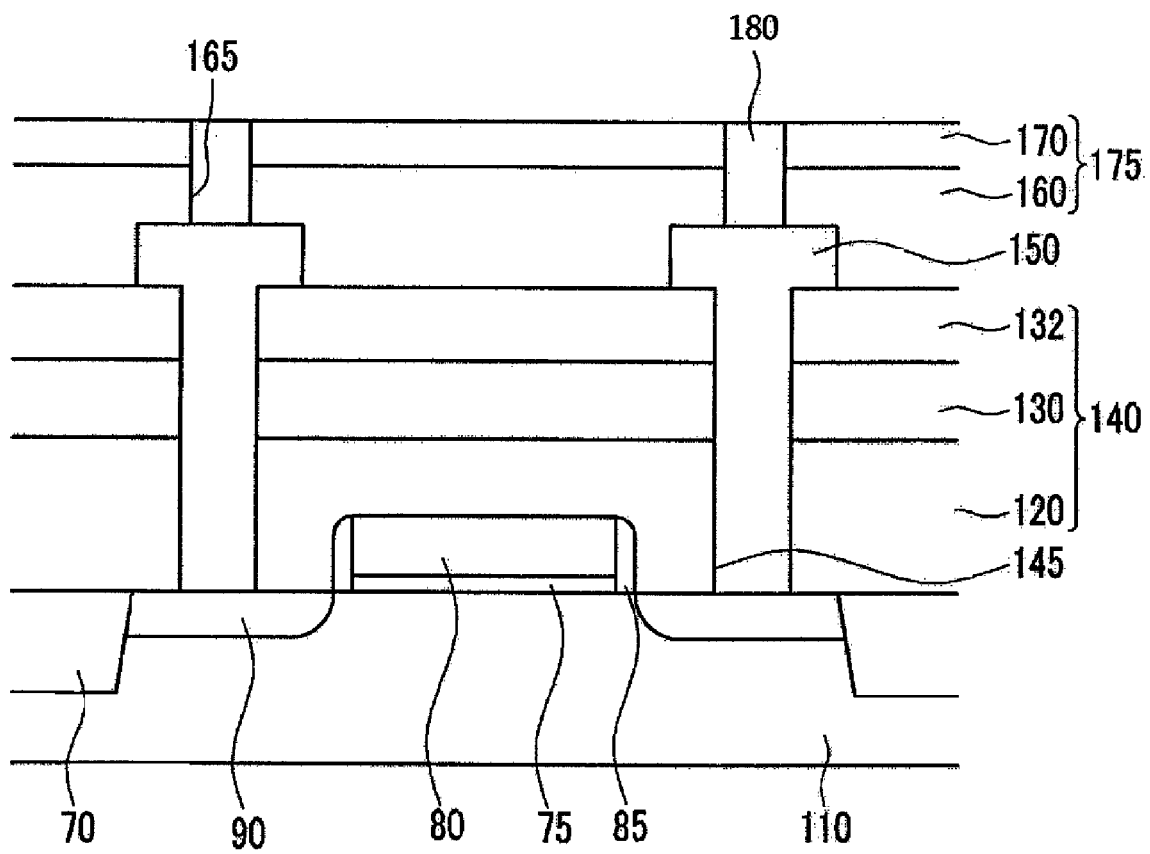

Example FIGS. 2 and 3 illustrate a manufacturing process of a semiconductor device, according to embodiments. As illustrated in FIG. 2, gate insulating layer 75 and gate electrode 80 may be deposited and patterned over semiconductor substrate 110. Semiconductor substrate 110 may include isolation layer 70 and/or high-density junction area 90. Spacer 85 may be formed on the side of gate insulating layer 75 and gate electrode 80. First inter-metal dielectric layer 140 may include HDP insulating layer 120, TEOS layer 130, and first diffusion barrier 132. First inter-metal dielectric layer 140 may have first via hole 145 formed over semiconductor substrate 110. First diffusion barrier 132 may include SRO (silicon rich oxide). SRO may include silane ($SiH_4$). First diffusion barrier 132 may have a thickness of at least 1000 Å, in accordance with embodiments. First metal interconnection 150 may be electrically connected to high-density junction area 90 of semiconductor substrate 110 through first via hole 145.

In embodiments, since HDP insulating layer 120 may include USG and/or FSG, fluorine (F) may be outgassed. First diffusion barrier 132 may be formed over HDP insulating layer 120. First diffusion barrier 132 may include SRO (silicon rich oxide), which may include silane ($SiH_4$). Silane ($SiH_4$) may react with oxygen or hydrogen in the air or in moisture. Fluorine that may be in HDP insulating layer 120 may not react with hydrogen, which may prevent formation of hydrogen fluoride. If hydrogen fluoride is not generated, the adhesive force between first metal interconnection 150 and first inter-metal dielectric layer 140 may be improved. A peeling process to remove hydrogen fluoride may not be necessary if hydrogen fluoride is not generated, which may simplify a manufacturing process.

In embodiments, fluorine in first inter-metal dielectric layer 140 may be blocked by first diffusion barrier 132, so that fluorine cannot penetrate into first metal interconnection 150. If fluorine cannot penetrate into first metal interconnection 150, defects in metal interconnection may be prevented.

As illustrated in FIG. 3, in accordance with embodiments, second inter-metal dielectric layer 175 may have second via hole 165 formed over first diffusion barrier layer 132 and first metal interconnection 150. Second inter-metal dielectric layer 175 may be formed by forming HDP insulating layer 160 (e.g. including USG (undoped silicate glass) and FSG (fluorine-doped silicate glass)) and/or second diffusion barrier 170 (e.g. including SRO (silicon rich oxide) that contains silane ($SiH_4$)). Tungsten (W) may be filled in second via hole 165 of second inter-metal dielectric layer 175. A chemical mechanical polishing (CMP) process may be performed to form second metal interconnection 180 which is electrically connected to first metal interconnection 150.

Metal pad 190, illustrated in FIG. 1, may be formed over second diffusion barrier 170 and second metal interconnection 150. Metal pad 190 may include aluminum.

Second inter-metal dielectric layer 175 may include HDP insulating layer 160, which may include fluorine (F). Fluorine (F) may react with hydrogen in the air or moisture to produce hydrogen fluoride. In embodiments, second diffusion barrier 170 may be formed on HDP insulating layer 160, so that silane ($SiH_4$) in second diffusion barrier 170 may react with fluorine. In embodiments, fluorine in HDP insulating layer 120 may not react with hydrogen in the air or with moisture, which may prevent formation of hydrogen fluoride. If hydrogen fluoride is not generated, the adhesive force between second metal interconnection 180 and second inter-metal dielectric layer 175 may be improved. In embodiments, a peeling process may not be required to remove hydrogen fluoride, which may simplify a manufacturing process. If fluorine in second inter-metal dielectric layer 175 is blocked by second diffusion barrier 170, fluorine may be prevented from penetrating into a second metal interconnection. In embodiments, it may be possible to prevent defects at a metal interconnection.

Figure 4:
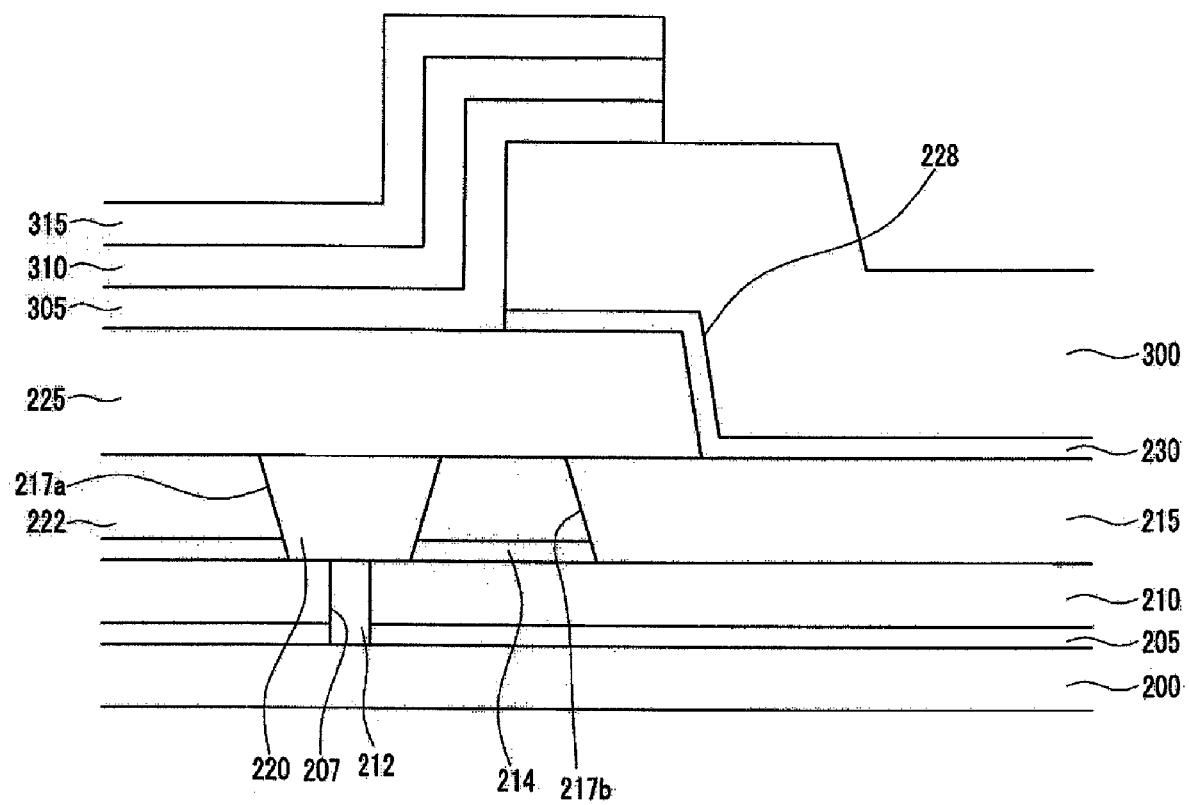
FIG. 4 is a sectional view illustrating a semiconductor device, according to embodiments.

Example FIG. 4 is a sectional view illustrating a semiconductor device, according to embodiments. In embodiments, a metal interconnection maybe formed by a damascene process. First etch stop layer 205 having first via hole 207 and interlayer dielectric layer 210 may be formed over a semiconductor substrate 200 including a conductive layer. First metal interconnection 212 may be formed in first via hole 207. Second etch stop layer 214 having trench 217b and interconnection insulation layer 222 having trench 217a may be formed over first metal interconnection 212 and interlayer dielectric layer 210.

Second metal interconnections 220 and 215 may be formed in trenches 217a and 217b. HDP FSG layer 225 having second via hole 228 (e.g. which exposes metal interconnection 215) may be formed over interconnection insulating layer 222 and second metal interconnections 215 and 220. First silicon oxide layer 230 including silane ($SiH_4$) and metal pad 300 may be formed over second metal interconnection 215 and a part of HDP FSG layer 225.

HDP USG layer 305, second silicon oxide layer 310 including silane ($SiH_4$), and passivation layer 315 including silicon nitride (SiN) may be formed over HDP FSG layer 225 and a part of metal pad 300. First silicon oxide layer 230 and second silicon oxide layer 310 may include SRO (silicon rich oxide) having the dangling bond, in which valence electrons may not be completely bonded.

Figure 5:
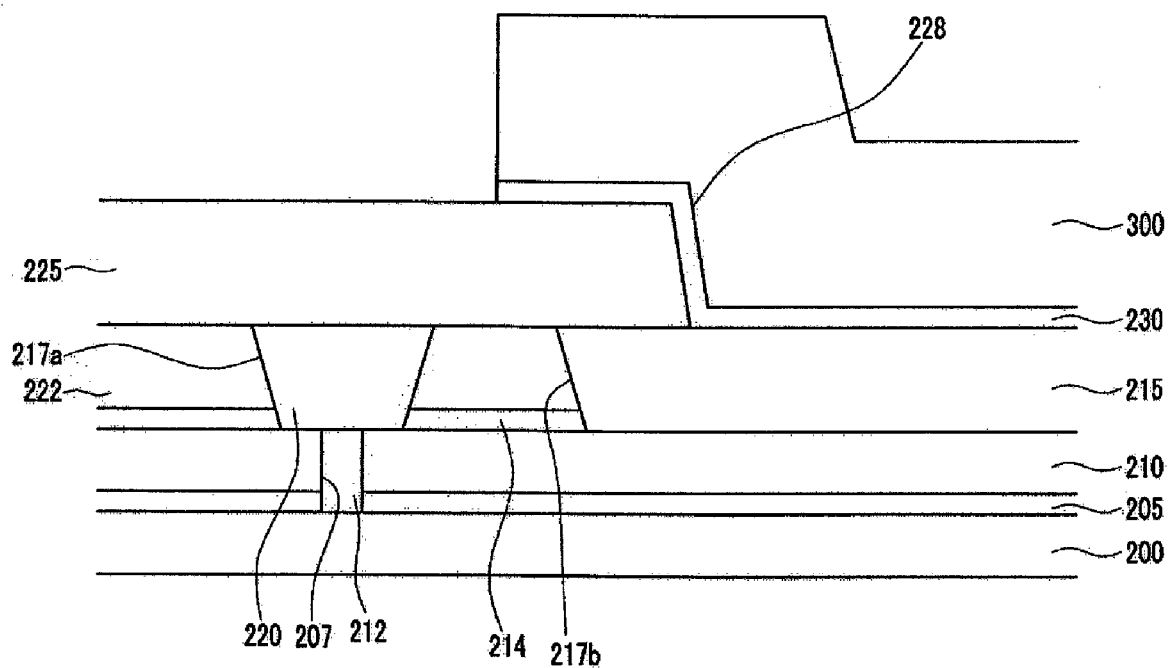
FIGS. 5 and 6 are sectional views illustrating a manufacturing process of a semiconductor device, according to embodiments.
Figure 6:
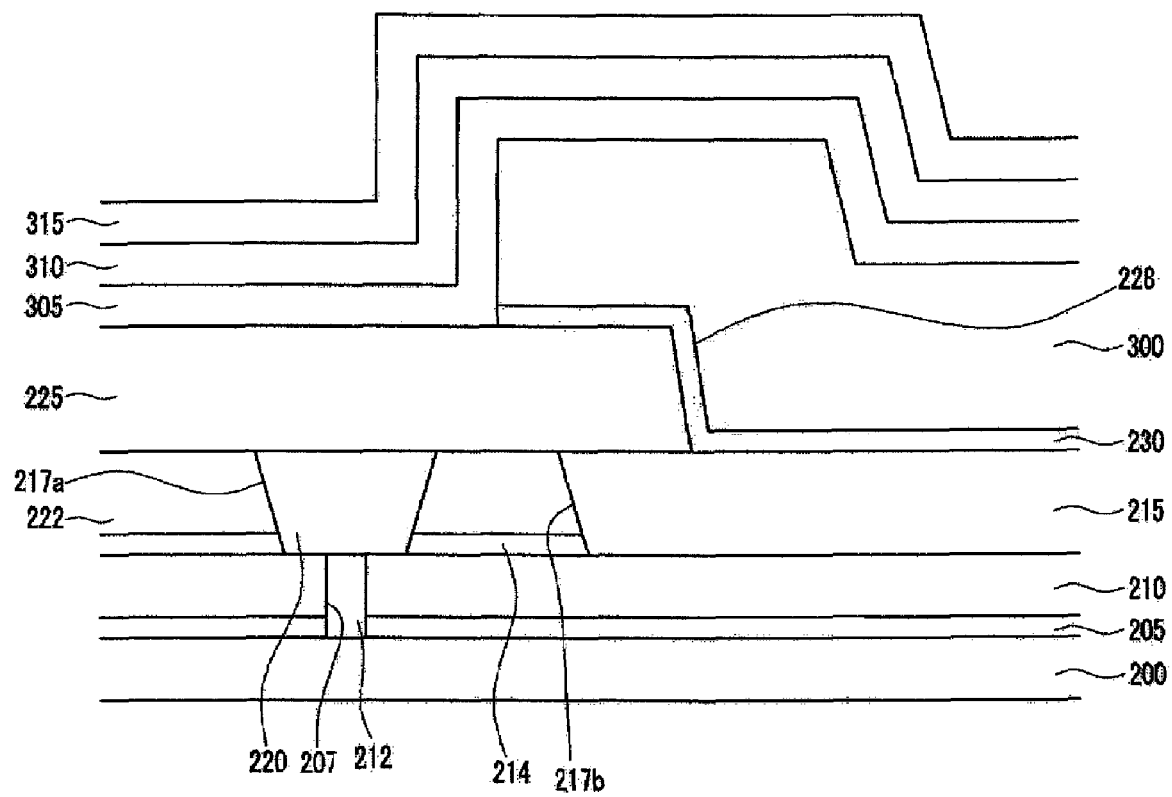

Example FIGS. 5 and 6 are sectional views illustrating a manufacturing process of a semiconductor device, according to embodiments. First etch stop layer 205 and interlayer dielectric layer 210 may be formed over semiconductor substrate 200. First etch stop layer 205 and interlayer dielectric layer 210 may be patterned to form first via hole 207. A first metal interconnection may be formed in first via hole 207. Second etch stop layer 214 and interconnection insulating layer 222 may be deposited over interlayer dielectric layer 210. Second etch stop layer 214 and interconnection insulating layer 222 may be patterned to form trenches 217a and 217b. Second metal interconnections 215 and 220 may be formed in trenches 217a and 217b.

HDP FSG layer 225 may be formed over second metal interconnections 215 and 220 and interconnection insulating layer 222. HDP FSG layer 225 may be patterned, to form second via hole 228. First silicon oxide layer 230 and metal pad 300 (which may have a low degree of oxidation) may be formed over second metal interconnection 215 and a part of HDP FSG layer 225. HDP FSG layer 225 may contain fluorine. If fluorine reacts with hydrogen contained in the air or moisture, hydrogen fluoride may be produced, which may cause defects in metal interconnections or lower the adhesive force of metal interconnections.

In embodiments, first silicon oxide layer 230 may be formed over HDP FSG layer 225. First silicon oxide layer 230 may include SRO (silicon rich oxide), which may include silane (SiH4), which may react with fluorine. Fluorine may react with silane (SiH4) rather than with hydrogen in the air or moisture to prevent the production of hydrogen fluoride. Fluorine in HDP FSG layer 225 may be blocked by first silicon oxide layer 230, preventing penetration of fluorine into second metal interconnection 215 to prevent defects in second metal interconnection 215.

As illustrated in FIG. 6, HDP USG layer 305, second silicon oxide layer 310, and passivation layer 315 may be formed over HDP FSG layer 225 and metal pad 300. Passivation layer 315 may be formed by using silane (SiH4) and ammonia (NH3) as a reaction gas and it may include hydrogen (H). In embodiments, second silicon oxide layer 310 may have a thickness of at least 1500 Å.

Fluorine (F) gas, which may be emitted from HDP FSG layer 225, may diffuse into passivation layer 315 and reacts with hydrogen (H) in passivation layer 315, thereby forming hydrogen fluoride (HF). Hydrogen fluoride (HF) may make voids in passivation layer 315, which may degrade the reliability and characteristics of a semiconductor device. If hydrogen fluoride is formed, it may be necessary to perform a peeling process to remove hydrogen fluoride (HF).

In embodiments, second silicon oxide layer 310 (which may include a material identical to the material included in first silicon oxide layer 230) may be directly aligned below passivation layer 315, which may prevent fluorine (F) emitted from HDP FSG layer 225 from diffusing into passivation layer 315. In embodiments, reliability may be improved in a semiconductor device, without performing a peeling process.

Table 1 illustrates examples of the percentage of hydrogen fluoride (HF) formed on a silicon nitride (SiN) layer in relation to the position and thickness of a silane (SiH4) layer and the content of fluorine in a FSG layer in a state in which the silane (SiH4) layer is interposed between the FSG layer including fluorine (F) and the SiN layer.

TABLE 1

| PROCESS STEP | SAMPLE CONSTRUCTION | | | | |
| --- | --- | --- | --- | --- | --- |
| | 1 | 2 | 3 | 4 | 5 |
| 1st insulating layer with F | HDP FSG | HDP FSG | HDP FSG | SiP4 flow rate Increase by 2 sccm. | SiF4 flow rate Increase by 4 sccm. |
| 2nd insulating layer | HDP USG 1500 Å | HDP USG 1500 Å | HDP USG 1500 Å | HDP USG 1500 Å | HDP USG 1500 Å |
| SiH4 layer | Cap SiH4 1500 Å | Cap SiH4 1500 Å | Skip | Cap SiH4 1500 Å | Cap SiH4 1500 Å |
| 3rd insulating layer | HDP USG 4000 Å | HDP USG 4000 Å | HDP USG 4000 Å | HDP USG 4000 Å | HDP USG 4000 Å |
| SiH4 layer | Skip | Skip | Cap SiH4 1500 Å | Skip | Skip |
| SiN layer percentage of HF in SiN area | Nitride 6000 Å 5% area | Nitride 6000 Å 20% area | Nitride 6000 Å No peelng Found | Nitride 6000 Å 10% area | Nitride 6000 Å 80% area |

As illustrated in example Table 1, fluorine contained in a first insulating layer may diffuse into SiN layer, so that hydrogen fluoride (HF) may be formed in SiN layer. The percentage of hydrogen fluoride created in SiN layer aligned on first insulating layers (e.g. see columns 4 and 5 in Table 1) in which the SiF4 flow rate is increased by 2 sccm and 4 sccm compared with first insulating layers including HDP FSG (e.g. see columns 1 and 3 in Table 1). The diffusion of fluorine may produce a relatively large amount of hydrogen fluoride even if the amount of fluorine is relatively low, which may result in negative influences in a semiconductor device.

As illustrated in example Table 1, when SiH4 layers have different thickness of 1500 Å and 1000 Å(e.g. see columns 1 and 2 in Table 1) under the same position and thickness conditions of the first and second insulating layers (e.g. an SiN layer and an SiH4 layer), the percentage of hydrogen fluoride formed in a SiN layer aligned on the SiH4 layer having the thickness of 1500 Å is lower than hydrogen fluoride formed in the SiN layer aligned on the SiH4 layer having the thickness of 1000 Å.

As illustrated in example Table 1, when a SiH4 layer is directly positioned below a SiN layer, the percentage of hydrogen fluoride formed on silicon nitride is 5% or less. Accordingly, it may not be necessary to perform a peeling process to remove hydrogen fluoride. In embodiments, a SiH4 layer having the thickness of at least 1500 Åmay be directly align below the SiN layer to prevent diffusion of fluorine (F) gas.

In embodiments, a SRO (silicon rich oxide) layer, which may include SiH4, may be formed on an insulating layer including fluorine to prevent the reaction of fluorine with hydrogen. Defect in a metal interconnection may be prevented and adhesive force of a metal interconnection may be improved in embodiments. In embodiments, fluorine may be prevented from reacting with hydrogen without performing additional manufacturing processes, thus simplifying the manufacturing process. In embodiments, quality and reliability of a semiconductor device may be improved.

It will be obvious and apparent to those skilled in the art that various modifications and variations can be made in the embodiments disclosed. Thus, it is intended that the disclosed embodiments covers the obvious and apparent modifications and variations, provided that they are within the scope of the appended claims and their equivalents.

What is claimed is:

1. A semiconductor device comprising an insulating layer and a metal interconnection, wherein:
the insulating layer comprises a first layer;
the first layer comprises fluorine;
the insulating layer comprises a second layer;
the second layer comprises silicon rich oxide;
the silicon rich oxide has a dangling bond;
the metal interconnection is formed over the insulating; and
the insulating layer comprises a TEOS layer between the first layer and the second layer.

2. The semiconductor device of claim 1, wherein the insulating layer comprises a via hole and the metal interconnection is formed in the via hole.

3. The semiconductor device of claim 1, wherein the second layer comprises silane (SiH4).

4. The semiconductor device of claim 1, wherein the first layer comprises fluorine-doped silicate glass.

5. The semiconductor device of claim 1, wherein the second layer has a thickness of at least 1000 Å.

6. A semiconductor device comprising:
a first insulating layer formed on a semiconductor substrate, wherein the first insulating layer comprises a first via hole, wherein the first insulating layer comprises a first layer comprising fluorine and a second layer comprising silicon rich oxide having a dangling bond;
a first metal interconnection formed in the first via hole;
a second insulating layer formed over the first insulating layer, wherein the second insulating layer comprises a second via hole, wherein the second insulating layer comprises a third layer comprising fluorine and a fourth layer comprising silicon rich oxide having a dangling bond;
a second metal interconnection formed in the second via hole, wherein the second metal interconnection is electrically connected to the first metal interconnection; and
a metal pad formed over the second insulating layer, wherein the metal pad is electrically connected to the second metal interconnection,
wherein the first insulating layer comprises a TEOS layer between the first layer and the second layer.

7. The semiconductor device of claim 6, wherein:
the second layer comprises silane (SiH4); and
the fourth layer comprises silane (SiH4).

8. The semiconductor device of claim 6, wherein:
the first layer comprises fluorine-doped silicate glass; and
the third layer comprises fluorine-doped silicate glass.

9. The semiconductor device of claim 6, wherein:
the second layer has a thickness of at least 1000 Å; and
the fourth layer has a thickness of at least 1000 Å.

10. A semiconductor device comprising:
a first insulating layer comprising a first via hole and a trench, wherein the trench is adjoining the first via hole;
a metal interconnection formed in the first via hole and the trench;
a second insulating layer formed over the first insulating layer, wherein the second insulating layer comprises a second via hole, and wherein the second insulating layer comprises fluorine;
a metal pad formed in the second via hole; and
a first diffusion barrier between the second insulating layer and the metal pad, wherein the first diffusion barrier comprises silicon rich oxide having a dangling bond;
a second diffusion barrier formed over the metal pad; and
a passivation layer formed over the second diffusion barrier,
wherein the passivation layer comprises silicon nitride (SiN).

11. The semiconductor device of claim 10, wherein the first diffusion barrier comprises silane (SiH4).

12. The semiconductor device of claim 10, wherein the second insulating layer comprises fluorine-doped silicate glass.

13. The semiconductor device of claim 10, wherein the second layer has a thickness of at least 1000 Å.

14. The semiconductor device of claim 10, wherein the second diffusion barrier comprises silicon rich oxide having a dangling bond.

15. The semiconductor device of claim 10, wherein the second diffusion barrier comprises silane (SiH4).

16. A method of manufacturing a semiconductor device, wherein the method comprises:
forming a first layer over a semiconductor substrate, wherein the first layer comprises fluorine;
forming a second layer over the first layer, wherein the second layer comprises silicon rich oxide having a dangling bond;
forming a via hole by patterning the first layer and the second layer;
forming a metal interconnection in the via hole; and
forming a TEOS layer between the first layer and the second layer.

17. The method of claim 16, wherein the second layer comprises silane (SiH4).

18. The method of claim 16, wherein the first layer comprises fluorine-doped silicate glass.

19. The method of claim 16, wherein the second layer has a thickness of at least 1000 Å.

* * * * *